United States Patent
Bean et al.

[11] Patent Number: 5,196,378
[45] Date of Patent: Mar. 23, 1993

[54] METHOD OF FABRICATING AN INTEGRATED CIRCUIT HAVING ACTIVE REGIONS NEAR A DIE EDGE

[75] Inventors: Kenneth E. Bean, Celina; John Powell, Canton; Jack W. Freeman, Plano, all of Tex.; Robert D. McGrath, Andover, Mass.

[73] Assignee: Texas Instruments Incorporated, Dallas, Tex.

[21] Appl. No.: 679,122

[22] Filed: Mar. 25, 1991

Related U.S. Application Data

[60] Division of Ser. No. 550,234, Jul. 10, 1990, abandoned, which is a continuation of Ser. No. 363,314, Jun. 5, 1989, abandoned, which is a continuation of Ser. No. 134,398, Dec. 17, 1987, abandoned.

[51] Int. Cl.$^5$ .................. H01L 21/00; H01L 21/02; H01L 21/78
[52] U.S. Cl. .................. 437/226; 437/225; 437/227; 148/DIG. 28; 148/DIG. 168; 357/55
[58] Field of Search .............. 357/60, 55; 437/226, 437/227, 225; 148/DIG. 28, DIG. 168

[56] References Cited

U.S. PATENT DOCUMENTS

| | | | |
|---|---|---|---|
| 3,432,919 | 3/1969 | Rosvold | 437/226 |
| 3,608,186 | 9/1971 | Hutson | 357/55 |
| 4,236,296 | 12/1980 | Woolhouse et al. | 437/226 |
| 4,542,397 | 9/1985 | Biegelsen et al. | 357/60 |
| 4,698,131 | 10/1987 | Araghi et al. | 357/60 |

FOREIGN PATENT DOCUMENTS 0008700 1/1984 Japan ................... 437/226

OTHER PUBLICATIONS

Hibberd, *Integrated Circuits*, McGraw-Hill, 1969, pp. 38–43.
Hamilton and Howard, *Basic Integrated Circuit Engineering*, (McGraw-Hill, N.Y., 1975), pp. 4–9.

*Primary Examiner*—Brian E. Hearn
*Assistant Examiner*—B. Everhart
*Attorney, Agent, or Firm*—Richard A. Stoltz; Richard L. Donaldson; Jay Cantor

[57] ABSTRACT

The invention relates to a method of scribing and separating dice from each other after fabrication in a semiconductor wafer in a manner such that active circuit regions in the dice reside as near to an edge of a die as possible. The wafer is anistropically etched through the active layer and into the substrate through an opening in the mask to form a generally V-shaped channel with the dice then being separated along a vertex of the channel. The dice are then positioned to abut each other in the form of a mosaic.

10 Claims, 2 Drawing Sheets

METHOD OF FABRICATING AN INTEGRATED CIRCUIT HAVING ACTIVE REGIONS NEAR A DIE EDGE

This application is a division of application Ser. No. 07/550,234, filed Jul. 10, 1990 now abandoned, which is a continuation of application Ser. No. 07/363,314 filed Jun. 5, 1989 now abandoned, which is a continuation of application Ser. No. 07/134,398 filed Dec. 17, 1987 now abandoned.

TECHNICAL FIELD OF THE INVENTION

The present invention relates in general to integrated circuit devices and the fabrication thereof. Specifically, the present invention relates to an integrated circuit device in which active circuit regions reside as near to an edge of a die as possible.

BACKGROUND OF THE INVENTION

In the design and construction of an electronic imaging system, a system's optics often focus an image on a focal plane which exhibits a predetermined geometrical shape and size. Electronic sensors may then be located on the focal plane to measure varying amounts of light focused thereon. Often, such sensors represent arrays of photo diodes or photo transistors, each one of which is called a pixel herein. Greater precision of an image may be obtained by focusing the image over a greater number of pixels. Thus, it would be desirable to provide integrated circuit devices which maximize the number of pixels that are contained within a given integrated circuit surface area and to manufacture such integrated circuits to be as large as possible. Specifically, the fabrication of a single integrated circuit large enough to contain all pixels needed for an imaging system would be a most desirable solution. However, device yields on an extremely large integrated circuit would be so low that this approach is not practical. The current state of integrated circuit manufacturing technology places limits on the minimum pixel size, number of pixels manufacturable in a given defect free area, and the maximum defect free integrated circuit surface area that can be processed into a single integrated circuit. Accordingly, greater precision may then be obtained at a reasonable yield by making an array of circuit chips containing pixels from several relatively small individual integrated circuit devices, wherein the devices are abutted against one another as tightly as possible.

However, when individual integrated circuit devices abut together to form an integrated circuit mosaic which functions as an imaging array, potential problems arise due to the junction between individual devices. For example, each of the integrated circuit devices or chip dice should contain active regions or pixels extending completely to a die edge. Otherwise, such an imaging system will have dead zones in the sensor array at dice edges where pixels have been omitted.

In addition, two chips or dice which abut together should fit together as tightly as possible to minimize dead zones between the dice. Accordingly, tolerances which are maintained while separating a die from a wafer within which the die is manufactured should be minimized to ensure a tight fit. In other words, the die edge should be as smooth as possible to minimize any uncertainty about the precise location of a die edge. Such uncertainties cause the dice in a mosaic to be spaced apart, and an imaging system constructed thereof has excessively large dead zones.

Furthermore, the electrically active or epitaxial layer of a die in the vicinity of a die edge should be preserved in an undamaged form. Pixels which reside in a damaged area of an electrically active layer near a die edge may exhibit a response which differs from that of pixels more centrally located in the die. Accordingly, a damaged electrically active layer may produce severe non-uniformity in a resulting image.

Prior art dice are typically separated from a wafer by a process which scribes and then cleaves or saws between adjacent dice. Such techniques tend to provide a relatively coarse tolerance within which a die edge is defined. Additionally, such techniques tend to damage the electrically active layer near the die edge. Although edge roughness may be smoothed somewhat by polishing after dicing, the polishing process and fixturization requirements of the polishing process tend to damage the electrically active layer near the dice edges. Consequently, the industry has a need for a mosaicable die which may be abutted against another mosaicable die as tightly as possible and which permits active circuitry near or at a die edge.

SUMMARY OF THE INVENTION

Accordingly, it is an advantage of the present invention that an integrated circuit die is provided with a die edge that minimizes damage to an electrically active layer of the die near the die edge.

Another advantage of the present invention is that a die is provided in which a tight tolerance may be achieved for the location of a die edge.

Yet another advantage of the present invention is that an integrated circuit mosaic is provided in which integrated circuit active regions may be selectively located in very close spatial proximity to a junction between dice.

Still another advantage of the present invention is that an integrated circuit mosaic is provided with a large combined active region and which experiences an improved device yield compared to a single integrated circuit having substantially the same size active region as the mosaic.

The above advantages of the present invention are carried out in one form by an integrated circuit die in which a first layer overlies a second layer, and the first layer is bound by die edges. A first substantially planar surface resides entirely on the first layer. A second substantially planar surface intersects the first surface so that the intersection between the first and second surfaces represents a substantially straight line. In addition, the first and second surfaces intersect to form an oblique angle, and separate portions of the second surface reside on the first and second layers. Furthermore, a third surface intersects the second surface so that the intersection represents a substantially straight line. The third surface resides entirely on the second layer.

In another aspect of the present invention, a mosaicable integrated circuit die is manufactured by a process in which a mask is applied to a substantially planar surface of a first layer of a wafer. The first layer overlies a second layer. The mask covers active regions of the die, but has a substantially straight line opening at an edge of the die between adjacent die corners. Next, the wafer is anisotropically etched through the first layer into the second layer in the vicinity of the opening.

BRIEF DESCRIPTION OF THE DRAWINGS

A more complete understanding of the present invention may be derived by referring to the detailed description and claims when considered in connection with the accompanying drawings, in which like reference numbers indicate like features throughout the drawings, and wherein:

DETAILED DESCRIPTION

Figure 1:
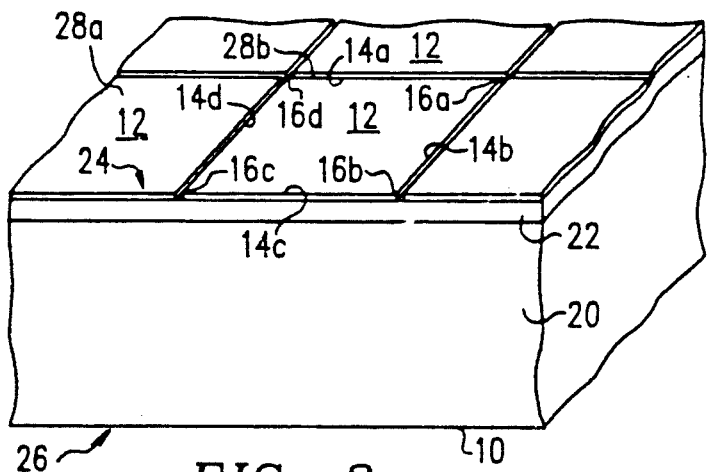
FIG. 1 shows a semiconductor wafer.

FIG. 1 shows a silicon semiconductor wafer 10 which, in the preferred embodiment, exhibits a (100) crystalline orientation. Those skilled in the art will recognize that silicon exhibits a diamond cubic structure. Thus, in the (100) orientation a surface of wafer 10 is a (100) plane of the silicon crystalline structure. A plurality of individual integrated circuits 12, referred to as dice herein, are formed on the surface of wafer 10.

Dice 12 may contain circuitry which perform any one of a large number of functions. One such function may, for example, represent an imaging array. However, the present invention does not limit device 12 to performing any single particular electrical function. Accordingly, the present invention contemplates relatively conventional techniques of processing dice 12 and of designing the functions performed by dice 12, except for the structure and formation of the region of a dice 12 near exterior die edges 14a, 14b, 14c, and 14d.

In the preferred embodiment, each of dice 12 has a generally rectangular shape so that die edges 14a-14d perpendicularly intersect each other. A flat 15 of wafer 10 indicates the alignment of the crystalline structure of wafer 10. Moreover, in the preferred embodiment die edges 14a-14d extend either perpendicularly or parallel to flat 15 of wafer 10. As a result, die edges 14a-14d are substantially in crystallographic alignment with directions <110> of the crystalline structure of wafer 10.

Specifically, die edges 14a-14d represent the exterior boundaries for each of dice 12. In addition, each of dice 12 has four die corners, labeled 16a, 16b, 16c, and 16d in FIG. 1. Die corners 16a and 16b represent adjacent corners with die edge 14b being a straight line segment that terminates at corners 16a and 16b. Likewise, die edge 14c forms a straight line segment that terminates at adjacent die corners 16b and 16c. Similarly, die edge 14d forms a straight line segment that terminates at adjacent corners 16c and 16d. Moreover, die edge 14a forms a straight line segment that terminates at adjacent die corners 16d and 16a.

Figure 2:
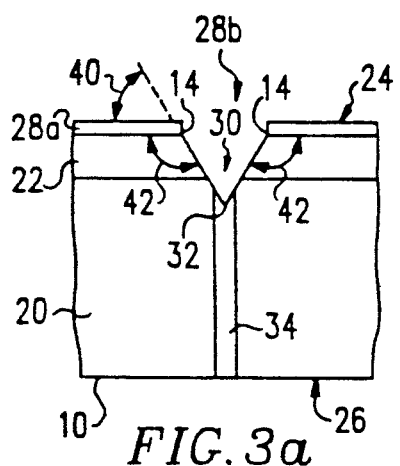
FIG. 2 shows a perspective view of a portion of a wafer that contains a die.

FIG. 2 shows a perspective view of a portion of wafer 10 that resides around one of dice 12. In addition, FIG. 2 illustrates initial processing steps of the present invention. Specifically, an electrically active layer 22 is formed over a silicon substrate layer 20. Electrically active layer 22 represents an epitaxial layer or a portion of a bulk silicon substrate in which electrically active devices reside. An electrically active layer 22 typically exhibits a thickness in the range of 1–15 microns, while a substrate layer 20 is typically many mils thick. A mask having a solid portion 28a and an opening portion 28b is then formed on layer 22.

Mask 28a–28b resides on a front-side surface 24 of wafer 10. Front-side surface 24 represents a substantially flat, smooth planar surface of layer 22. A back-side surface 26 of wafer 10 represents a generally planar surface of layer 20 that opposes and resides substantially parallel to front-side surface 24.

A solid portion 28a of the mask prevents etching of die 12 in an area of die 12 that underlies solid portion 28a. However, mask 28a–28b permits etching in the area of die 12 which underlies an opening portion 28b. Thus, mask 28a–28b is applied to front-side 24 so that solid portion 28a covers all active areas of die 12. The active areas represent the sections of die 12 that will contain circuitry such as transistors, metallization, or other structures typically formed in integrated circuits in later-occurring process steps. When the present invention is used in connection with a mosaicable integrated circuit in which active circuitry extends as near to a die edge 14 as possible, solid portion 28a covers all of front-side surface 24 except for thin, straight-line openings which form opening portion 28b at the boundaries between adjacent dice 12, outside of die edges 14a–14d for all of dice 12. Moreover, openings 28b are aligned with the <110> directions of wafer 10.

The preferred embodiment utilizes a thick oxide for solid mask portion 28a which is grown or deposited using conventional techniques. On the other hand, a conventional photoresist may successfully resist etching under solid portions thereof depending upon the particular type of etching chemistry to be used. Accordingly, those skilled in the art may select an appropriate material for solid mask portion 28a.

Figure 3A:
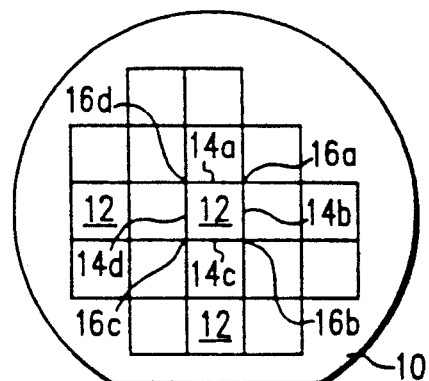
FIGS. 3A through 3C show cross-sectional views of a wafer in accordance with the present invention at a die edge illustrating three different techniques for separating dice.
Figure 3B:
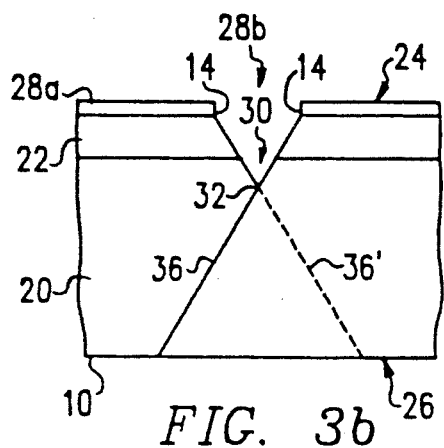
Figure 3C:
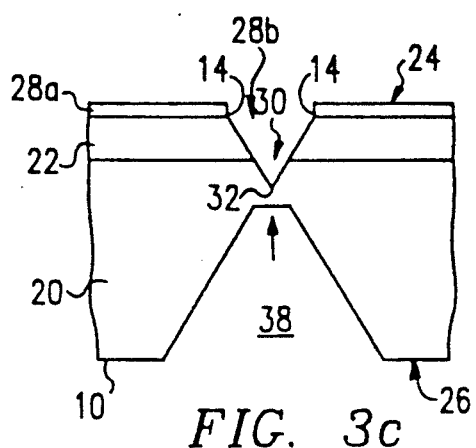

FIGS. 3A through 3C show a cross-sectional view of wafer 10 in the vicinity of die edges 14 of two adjacent dice 12. Die edges 14 shown in FIGS. 3A through 3C represent any one of edges 14a–14d. FIGS. 3A through 3C illustrate alternate subsequent steps in the process of manufacturing an integrated circuit die according to the present invention. Accordingly, after the deposition, and or formation, of mask 28a–28b, a channel 30 is etched into wafer 10 at opening 28b. This etching starts at opening 28b on front-side surface 24 and continues into wafer 10 through layer 22. The etching continues until channel 30 extends into layer 20.

The preferred embodiment utilizes an orientation dependent etch (ODE) or an anisotropic etch to remove portions of layers 22 and 20 in accordance with the pattern established by mask 28a–28b. Those skilled in the art will recognize that conventional etchants utilized in such an orientation dependent etch may etch in a <100> direction hundreds of times faster than they etch in, for example, a <111> direction. Furthermore, such etchants and the material of solid mask portion 28a may be chosen so that the etching of layer 22 and layer 20 will be complete before the chosen etchant etches through solid mask portion 28a. For example, the one embodiment uses a KOH-propanol etchant at 85° C. in the orientation dependent etch.

FIGS. 3A through 3C illustrate the results of such an orientation dependent etch while illustrating three different techniques for severing adjacent dice. Channel 30 may be seen to comprise a "V"-shaped with an opening on front-side surface 24 of wafer 10, and a vertex or point 32 of channel 30 residing in layer 20. The orientation dependent etch proceeds in the <100> direction into wafer 10 towards back-side surface 26 until the etch front hits those (111) planes that intersect the (100) plane of front-side surface 24 at the edge of mask opening 28b. Once the etch front hits these (111) planes, the etching slows to an etch rate characteristic of the <111> direction, which for all practical purposes is a stopping of the etch.

In a diamond cubic structure, a (111) plane intersects a (100) plane at a 54.74° angle. Accordingly, the etch depth to oxide opening width ratio of channel 30 is approximately 0.707. In other words, if a mask opening 28b is ten microns wide, the etch front will proceed approximately 7.07 microns into wafer 10, then stop. With a layer 22 being approximately six microns thick, for example, vertex 32 would reside within layer 20. Furthermore, only ten microns of front-side surface 24 would have been lost due to this etching. Therefore, mask 28a-28b defines die edges 14, and the side surfaces of V-shaped channel 30 form crystallographically smooth planes.

After the etching of channel 30, the processing of wafer 10 continues in a conventional manner. In other words, mask 28a-28b may be removed and various implants, diffusions, insulation layers, polycrystalline silicon layers, metallization layers (not shown), and the like which are used to form integrated circuits may be fabricated in a conventional manner.

After integrated circuit processing is complete, dice 12 may be separated from wafer 10. First, channel 30 is cleaned to remove oxides and other contaminants which may have grown within channel 30 during integrated circuit processing. A mask similar to the one used for forming channel 30 and conventional etchants known to those skilled in the art may be used for this purpose.

FIGS. 3A through 3C illustrate three different embodiments which may be used to accomplish the separation. FIG. 3A shows a separation of a die 12 from wafer 10 by sawing. In this embodiment, a saw cut 34 is made from front-side surface 24 toward back-side surface 26. Saw cut 34 is aligned or centered upon vertex 32 of V-shaped channel 30. Furthermore, in this embodiment the depth of channel 30 is dimensioned so that no portion of saw cut 34 reaches layer 22. Consequently, damage to electrically active layer 22 is less than would occur if a saw blade were to mechanically contact layer 22.

FIG. 3B illustrates a second embodiment for the separation of dice 12 from wafer 10. This second embodiment cleaves dice 12 apart from wafer 10 by the application of pressure to front-side surface 24 of wafer 10. V-shaped channel 30 tends to concentrate this pressure at vertex 32. Consequently, a fracture line 36 begins at vertex 32 and continues to back-side surface 26. Such pressure may be applied by rolling a heavy cylinder over front-side surface 24 after a lint-free paper or other protecting material has been applied over front-side surface 24 of wafer 10. Fracture 36 normally follows a (111) plane which is defined by a side surface of V-shaped channel 30. V-shaped channel 30 has two of such side surfaces. Accordingly, fracture line 36 may follow either one of the (111) surfaces, as shown at reference numerals 36 and 36' in FIG. 3B. In other embodiments fracture 36 may be made to occur on other planes by use of different mask alignments, such as <100> rather than <110>.

FIG. 3C illustrates a third embodiment for separating a die 12 from wafer 10. This third embodiment anisotropically etches wafer 10 from back-side surface 26 into wafer 10 toward front-side surface 24. This anisotropic etch is similar to that discussed above in connection with the formation of channel 30. Accordingly, a "V"-shaped channel 38 may be etched for a predetermined depth into layer 20 of wafer 10 by applying a mask (not shown) with an opening width bearing a predetermined relationship to a desired etch depth. The center of such an opening is aligned with vertex 32. In this embodiment, the etch depth would be slightly greater than the thickness of layer 20 plus the thickness of layer 22 minus the depth of channel 30. Consequently, die 12 separates from wafer 10 when channel 38 reaches vertex 32 of channel 30.

This third embodiment of separating dice 12 from wafer 10 represents a preferred embodiment. In this embodiment, vertex 32 may advantageously reside just slightly below layer 22 within layer 20. Consequently, the opening of channel 30 is kept as narrow as possible, and die edge 14 resides as close as possible to vertex 32 in a direction parallel to front-side surface 24. Still further, the etching of V-shaped channel 38 provides a predictable separation surface of layer 20.

Figure 4:
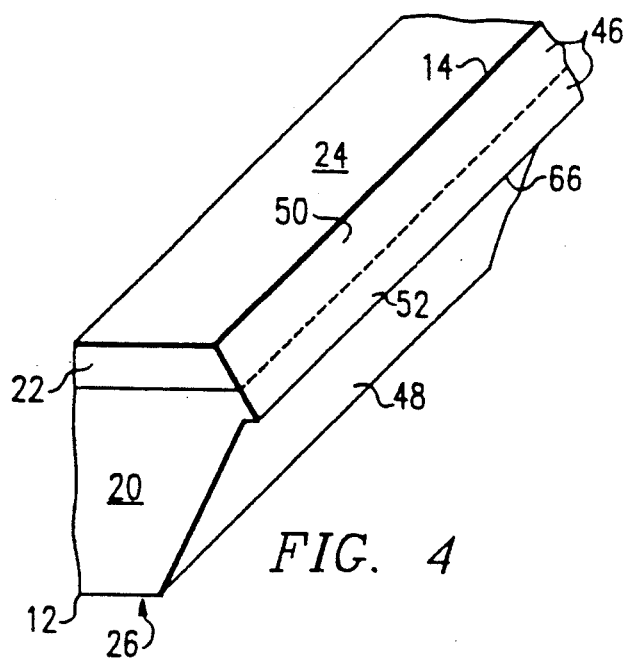
FIG. 4 shows a perspective view of a die separated from a wafer in accordance with the present invention.

FIG. 4 shows a perspective view of a portion of a die 12 after die 12 has been separated from wafer 10 (see FIGS. 1 and 2). FIG. 4 assumes that the third embodiment for separating die 12 from wafer 10 (discussed above) was performed. Accordingly, a portion of front-side surface 24 of wafer 10 resides entirely on layer 22, and surface 24 has active circuits (not shown) formed thereon. Die edge 14 presents a straight line that forms a boundary for surface 24. A crystallographically planar surface 46 intersects surface 24 at die edge 14. The variance or tolerance of die edge 14 around a perfectly straight line corresponds directly to the variance or tolerance of mask opening 28b (see FIG. 2). Since die edge 14 extends in the <110> direction of wafer 10, and since mask opening 28b is photolithographically defined, an extremely straight line results when compared to a line established by scribing, as used in conventional dicing techniques.

Surface 46 forms an oblique angle with surface 24. Specifically, since a <111> plane intersects a <100> plane at a 54.74° angle, surface 46 forms a 125.26° angle with surface 24. Furthermore, since vertex 32 of V-shaped channel 30 (see FIGS. 3A-3C) resides in layer 20, surface 46 has a first portion 50 which resides near die end 14 and is formed entirely on electrically active layer 22. In addition, surface 46 has second portion 52 which resides on an opposite side of first portion 50 from die edge 14 and which resides entirely in bulk crystal material on layer 20.

A straight abutting line 66 opposes and resides substantially parallel to die edge 14 on surface 46. Abutting line 66 is crystographically straight within limits imposed by the straightness of mask openings 28b and the alignment of mask openings 28b with the <110> directions of wafer 10 (see FIG. 2).

Furthermore, an interior surface 48 extends from abutting line 66 to back-side surface 26 and resides entirely on layer 20. By using the third embodiment discussed above for separating die 12 from wafer 10, surface 48 may not be precisely planar. However, a large portion of surface 48 is planar and forms a 125.26° angle with back-side surface 26. If the first embodiment for separating die 12 from wafer 10 were used, surface 48 would be substantially planar and perpendicular to both back-side surface 26 and surface 24. On the other hand, if the second embodiment for separating dice 12 from wafer 10 were used, surface 48 would be substantially planar and would form either a 125.26° or 54.74° angle with back-side surface 26.

Figure 5:
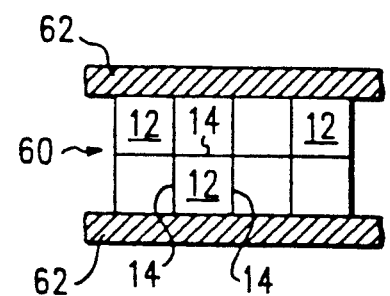
FIG. 5 shows an integrated circuit mosaic.

FIG. 5 shows one embodiment of a relatively large I/C mosaic 60 formed from abutting relatively smaller dice 12 together. Mosaic 60 may advantageously and at high process yield, be used to form a large imaging sensor which is located in the focal plane of an electronic imaging system. In such systems, each of dice 12 would contain active circuitry (not shown) to form a multiplicity of pixels. Furthermore, dice 12 are abutted together so that pixel deadzones which may occur between dice 12 are minimized. As shown in FIG. 5, each of dice 12 may abut another one of dice 12 on more than one of die edges 14. In a preferred embodiment, electrical connections are made between each of dice 12 and buses 62.

Figure 6:
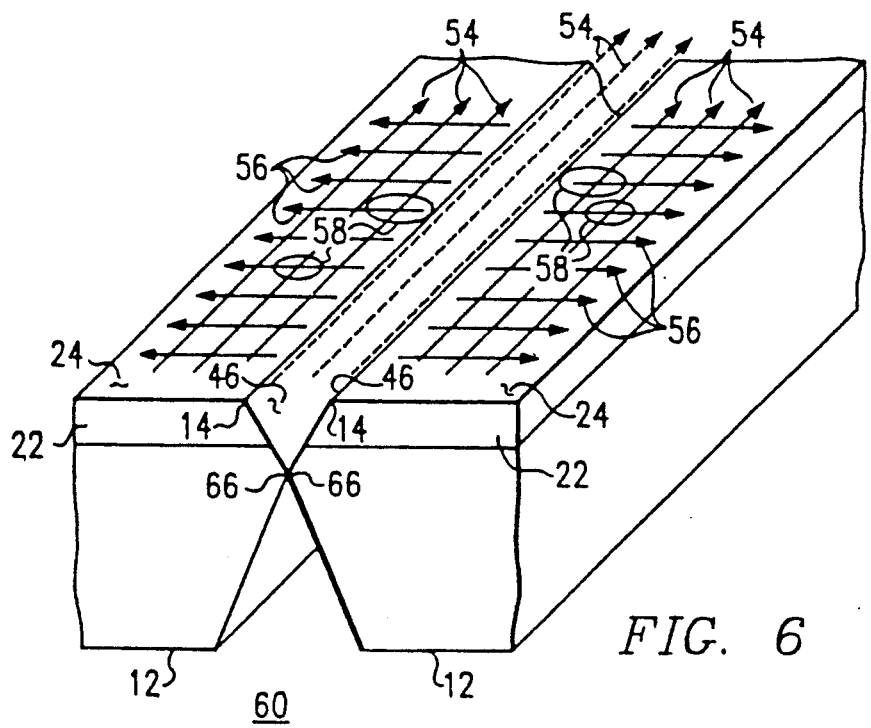
FIG. 6 shows a perspective view of a boundary between two dice in an integrated circuit mosaic.

FIG. 6 shows a perspective view of the junction between two of dice 12 which are located adjacent to one another within mosaic 60. Mosaic 60 minimizes the amount of space between active circuits 58 which reside on surfaces 24 of the respective dice 12. If, for example, dice 12 contain circuits for performing an electronic image sensing function, active circuits 58 surround each intersection of pixel column coordinates 54 with pixel row coordinates 56. As shown in FIG. 6, pixel column coordinates 54 extend substantially parallel to each other on surfaces 24 of each of dice 12. Pixel row coordinates 56 extend substantially parallel to each other and substantially perpendicular to pixel column coordinates 54 on surfaces 24 of each of dice 12. Although only a few of active circuits 58 are indicated in FIG. 6, those skilled in the art will understand that the entire surface 24 of each of dice 12 may be completely filled with active circuits 58, and that active circuits 58 may reside within a few microns of die edges 14.

The etching of channel 30 (see FIGS. 3A-3C) through layer 22 prevents later-occurring dicing steps from inflicting damaging stresses to electrically active layer 22. Thus, active circuits 58 located near die edges 14 exhibit substantially the same performance as similar circuits more centrally located on a surface 24.

Moreover, abutting line 66 for one of dice 12 contacts abutting line 66 for another of dice 12. The techniques discussed above cause abutting line 66 to be crystallographically straight within limits imposed by mask opening 28b (see FIG. 2) and the orientation of mask opening 28b relative to the <110> direction of wafer 10. Consequently, roughness or variation from a precisely straight line is minimized, and dice 12 fit closely together. Since dice 12 fit closely together, active circuits 58 from one of dice 12 may reside relatively near active circuits 58 on the other of dice 12. As discussed above, the third embodiment of separating dice 12 from wafer 10 permits the distance between die edge 14 and abutting line 66 to be minimized. Consequently, this minimized distance further allows active circuits 58 on one of dice 12 to be located near active circuits 58 on the other of dice 12.

As noted by dotted lines in FIG. 6, a few pixel column coordinates 54 overlie surfaces 46 of dice 12 rather than surfaces 24 of a dice 12. Active circuits do not reside in this area. When dice 12 are used in an imaging system application, a dead zone results from this lack of active circuitry. Nevertheless, the resulting dead zone is minimized because only a few pixel column coordinates 54 are affected. In addition, the deadzone is consistent across many different dice 12 junctions in the present invention.

In summary, the process of the present invention refrains from damaging electrically active layer 22 in the vicinity of die edge 14. Consequently, active circuits 58 may reside immediately adjacent to die edge 14. Furthermore, in an I/C mosaic 60, two of dice 12 may abut tightly together because the present invention provides a crystallographically accurate, straight abutting line 66 to define the contact point between dice 12. As a result, active circuits 58 on one of dice 12 may reside extremely close to active circuits 58 on the other one of dice 12.

The foregoing description uses various embodiments to illustrate the present invention. However, those skilled in the art will recognize that changes and modifications may be made in these embodiments without departing from the scope of the present invention. For example, the order of forming channels 30 in the overall process of fabricating an integrated circuit may be modified from that described herein. Thus, with appropriate masking of active regions, channels 30 may be etched after fabrication of active circuits on dice 12. Moreover, an integrated circuit mosaic need not be limited to an electronic imaging system as discussed herein but may, for example, be advantageously used in the construction of hybrids or other electronic circuits. Still further, the present invention need not be limited to epitaxial material but also applies to bulk silicon. These and other modifications obvious to those skilled in the art are intended to be included within the scope of this invention.

What is claimed is:

1. A method of forming integrated circuit dice on a wafer having a first electrically active layer overlying a second substrate layer, said method comprising the steps of:
    (a) providing a silicon semiconductor wafer having a first electrically active layer overlying a second substrate layer and integrated circuit dice having corners, said dice disposed in at least said first layer;
    (b) orienting said wafer so that said wafer represents a (100) orientation silicon crystal;
    (c) applying a mask to a surface of said first layer of said wafer which covers active regions of said dice and has an opening therethrough along an edge of each of said dice, said opening forming a substantially straight line between adjacent corners of each of said dice;
    (d) aligning said opening of said mask to be substantially in a <110> direction of the wafer;
    (e) anisotropically etching said wafer through said first layer and into said second layer through said opening to form a generally V-shaped channel in said first and second layers; and
    (f) separating adjacent dice along a vertex of said channel.

2. The method as claimed in claim 1 wherein said etching step comprises the step of removing portions of said first and second substrate layers beneath said opening to form said V-shaped channel with a vertex of said channel residing in said second layer.

3. A method as claimed in claim 2 further comprising the step of etching through said second layer beginning at an opposing surface of said wafer from said surface of said first layer, said etching being in alignment with said vertex of said V-shaped channel.

4. A method as claimed in claim 2 further comprising the step of sawing through said second layer beginning at the surface of said first layer, said sawing being in alignment with said vertex of said V-shaped channel and said sawing refraining from cutting said first layer of said wafer.

5. A method as claimed in claim 2 further comprising the step of cleaving through said second layer to originate a fracture line at said vertex of said V-shaped channel.

6. A method of forming integrated circuit mosaic comprising the steps of:
  (a) providing a silicon semiconductor wafer having a first electrically active layer overlying a second substrate layer and integrated circuit dice having corners, said dice disposed in at least said first layer;
  (b) orienting said wafer so that said wafer represents a (100) orientation silicon crystal;
  (c) applying a mask to a surface of said first layer of said wafer which covers active regions of said dice and has an opening therethrough along an edge of each of said dice, said opening forming a substantially straight line between adjacent corners of each of said dice;
  (d) aligning said opening of said mask to be substantially in a <110> direction of the wafer;
  (e) anisotropically etching said wafer through said first layer and into said second layer through said opening to form a generally V-shaped channel in said first and second layers;
  (f) separating adjacent dice along a vertex of said channel; and
  (g) abutting one of said dice adjacent another of said dice to form said mosaic.

7. The method as claimed in claim 6 wherein said etching step comprises the step of removing portions of said first and second substrate layers beneath said opening to form said V-shaped channel with a vertex of said channel residing in said second layer.

8. A method as claimed in claim 7 further comprising the step of etching through said second layer beginning at an opposing surface of said wafer from said surface of said first layer, said etching being in alignment with said vertex of said V-shaped channel.

9. A method as claimed in claim 7 further comprising the step of sawing through said second layer beginning at the surface of said first layer, said sawing being in alignment with said vertex of said V-shaped channel and said sawing refraining from cutting said first layer of said wafer.

10. A method as claimed in claim 7 further comprising the step of cleaving through said second layer to originate a fracture line at said vertex of said V-shaped channel.

* * * * *